(12) United States Patent
Hsieh et al.

(10) Patent No.: US 7,324,028 B2
(45) Date of Patent: Jan. 29, 2008

(54) SELF-CALIBRATING CONTINUOUS-TIME DELTA-SIGMA MODULATOR

(75) Inventors: Hong-Yean Hsieh, Sunnyvale, CA (US); Chia-Liang Lin, Union City, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 33 days.

(21) Appl. No.: 11/342,119

(22) Filed: Jan. 27, 2006

(65) Prior Publication Data
US 2007/0069931 A1 Mar. 29, 2007

Related U.S. Application Data

(60) Provisional application No. 60/596,437, filed on Sep. 23, 2005.

(51) Int. Cl.
*H03M 1/10* (2006.01)
(52) U.S. Cl. .............. 341/120; 341/118; 341/131; 341/143
(58) Field of Classification Search ............. 341/131
See application file for complete search history.

(56) References Cited

U.S. PATENT DOCUMENTS

| | | | |
|---|---|---|---|
| 4,558,361 A | | 12/1985 | Catros |
| 4,943,807 A | * | 7/1990 | Early et al. ............... 341/120 |
| 5,012,244 A | * | 4/1991 | Wellard et al. ............ 341/143 |
| 5,729,230 A | * | 3/1998 | Jensen et al. ............. 341/143 |
| 6,087,969 A | * | 7/2000 | Stockstad et al. ......... 341/143 |
| 6,184,812 B1 | * | 2/2001 | Younis et al. ............. 341/143 |
| 6,271,782 B1 | | 8/2001 | Steensgaard-Madsen |
| 6,346,898 B1 | | 2/2002 | Melanson |
| 6,362,763 B1 | * | 3/2002 | Wang ........................ 341/143 |
| 6,396,428 B1 | | 5/2002 | Cheng |
| 6,445,318 B1 | * | 9/2002 | Ruha et al. ............... 341/131 |
| 6,462,685 B1 | * | 10/2002 | Korkala ..................... 341/131 |
| 6,473,019 B1 | | 10/2002 | Ruha et al. |
| 6,670,902 B1 | | 12/2003 | Melanson et al. |
| 6,693,572 B1 | * | 2/2004 | Oliaei et al. .............. 341/143 |

(Continued)

FOREIGN PATENT DOCUMENTS

EP 0964524 A2 12/1999

(Continued)

OTHER PUBLICATIONS

Paton, Susan, et al., "A 70 -mW 300 MHz CMOS Continuous-Time SD ADC with 15 MHz Bandwidth and 11 Bits of Resolution," IEEE Journal of Solid -State Circuits, vol. 39, No. 7, Jul. 2004. pp. 1056-1063.

(Continued)

*Primary Examiner*—Khai M. Nguyen
(74) *Attorney, Agent, or Firm*—Knobbe, Martens, Olson & Bear LLP

(57) ABSTRACT

A self-calibrating continuous-time delta-sigma modulator determines whether time constants of its internal integrators are too large or too small by injecting a calibrating sequence into the modulator and examining a correlation between the calibrating sequence and a modulator output sequence. Then the time constants of the internal integrators are adjusted accordingly. In one embodiment, the correlation is exploited based on matching a noise transfer function of the modulator using an adaptive filter based on a least mean square (LMS) algorithm.

21 Claims, 13 Drawing Sheets

U.S. PATENT DOCUMENTS

| | | |
|---|---|---|
| 6,765,517 B1 * | 7/2004 | Ali .................... 341/143 |
| 6,791,400 B2 * | 9/2004 | Lou .................... 327/554 |
| 6,838,929 B2 * | 1/2005 | Mitteregger ............. 327/553 |
| 6,880,262 B1 | 4/2005 | Jensen |
| 6,930,624 B2 | 8/2005 | Hezar et al. |
| 6,940,434 B2 | 9/2005 | Brooks |
| 7,042,375 B1 * | 5/2006 | van Engelen ............ 341/131 |
| 7,095,345 B2 * | 8/2006 | Nguyen et al. ........... 341/120 |
| 7,098,730 B1 * | 8/2006 | Shui .................... 327/553 |
| 7,129,873 B2 * | 10/2006 | Kawamura ............... 341/143 |

FOREIGN PATENT DOCUMENTS

| | | |
|---|---|---|
| EP | 1418674 A1 | 6/2004 |
| JP | 60263534 A | 6/1984 |

OTHER PUBLICATIONS

Yan, Shouli, et al., "A Continuous-Time SD Modulator with 88-dB Dynamic Range and 1.1-MHz Signal Bandwidth," IEEE Journal on Solid-State Circuits, vol. 39, No. 1, Jan. 2001. p. 75-86.

GB Search and Examination Report dated Nov. 23, 2006. 6 pages.

Xia, Bo et al., AN RC Time Constant Auto-Tuning Structure for High Linearity Continuous-Time Modulators and Active Filters, IEEE Transactions on Circuits and Systems, pp. 2179-2188, I: Regular Papers, vol. 51, No. 11, Nov. 2004.

* cited by examiner

SELF-CALIBRATING CONTINUOUS-TIME DELTA-SIGMA MODULATOR

The present application claims priority benefits under 35 U.S.C. § 119(e) from U.S. Provisional Application No. 60/596,437, filed on Sep. 23, 2005, entitled "Self-Calibrating Continuous-Time Delta-Sigma Modulator," which is hereby incorporated herein in its entirety by reference.

BACKGROUND OF THE INVENTION

1. Field of the Invention

The present invention relates to a delta-sigma modulator and in particular to a method and apparatus for calibrating a continuous-time delta-sigma modulator.

2. Description of the Related Art

Delta-sigma modulators are widely used in over-sampling analog-to-digital converters (ADC) to achieve high-resolution analog-to-digital data conversion despite using coarse quantization. To date, most delta-sigma modulators use discrete-time loop filters. There has been much interest lately to use continuous-time loop filters. FIG. 1 depicts a block diagram of a typical delta-sigma modulator 200 that employs a continuous-time loop filter. For example, a continuous-time (or analog) input signal x(t) is fed to a quantizer 240 via a continuous-time loop filter 230 and converted into a discrete-time output sequence y[n]. The output sequence y[n] is fed back via a digital-to-analog converter (DAC) 260 to the continuous-time loop filter 230 as a second input. The quantizer 240 converts an input continuous-time signal into discrete-time samples at a rate controlled by a clock. The continuous-time loop filter 230 is usually constructed using one or more continuous-time integrators which are designed to mimic an ideal response of 1/sT, where T corresponds to a period of the clock. The continuous-time loop filter 230 also involves one or more signal routing and summing. For instance, a third order continuous-time loop filter 230 using three continuous-time integrators and three summing operations is depicted in FIG. 2.

The modulator output sequence y[n] is determined by the continuous-time input signal x(t), quantization error due to the quantizer 240, and response of the continuous-time loop filter 230. Although an explicit sampling circuit does not exist in the modulator 200 to convert the continuous-time input signal x(t) into discrete-time samples x[n], there is an implicit sampling operation performed on x(t) due to the quantizer 240 that operates synchronously with the clock. In accordance with the clock, the quantizer 240 generates a discrete-time output sequence which is also the output sequence y[n] of the modulator 200.

Equivalence theorem states that the continuous-time input signal x(t) can be represented equivalently by the discrete-time samples x[n]=x(t=nT) as far as its effects to the discrete-time output sequence y[n] is concerned. Along this line of thinking, FIG. 3A depicts a behavioral model commonly used to model the continuous-time delta-sigma modulator 200. For example, a sampler 205 converts the continuous-time input signal x(t) into the discrete-time samples x[n]. The behavior of the quantizer 240 is modeled as adding a quantization error sequence q[n] into the system. The discrete-time samples x[n] are filtered by a discrete-time filter G(z) 241 while the quantization error sequence q[n] is added to an output of the discrete-time filter 241 via a summer 249 to generate the output sequence y[n]. The output sequence is filtered by a discrete-time filter L(z) 243 before being fed back to be subtracted from the output of the discrete-time filter 241 via a summer 247. By way of example, the responses of the discrete-time filters G(z) 241 and L(z) 243 corresponding to the modulator depicted in FIG. 2 are as follows:

$G(z)=(1+z^{-1})/2/(1-z^{-1})^3$; and $L(z)=g_1/(z-1)+g_2/2 \cdot (z+1)/(z-1)^2+g_3/6 \cdot (z^2+4z+1)/(z-1)^3.$ FIG. 3B depicts a simplified version of the behavioral model depicted in FIG. 3A. For example, a sequence of the discrete-time samples x[n] is filtered by a signal transfer function STF(z) 245 while the quantizer error sequence q[n] is filtered by a noise transfer function NTF(z) 255. An output of STF(z) 245 is summed with an output of NTF(z) 255 in a summer 265 to result in the modulator output sequence y[n]. Both STF(z) 245 and NTF(z) 255 are determined by the loop filter 230. The responses of STF(z) 245 and NTF(z) 255 are related to the responses of G(z) 241 and L(z) 243 via the following relations:

$STF(z)=G(z)/(1+L(z))$; and $NTF(z)=1/(1+L(z)).$

Internal parameters of the continuous-time loop filter 230 (e.g., coefficients $g_1$, $g_2$, and $g_3$ in the loop filter 230 shown in FIG. 2) are chosen to achieve a target noise transfer function. Usually, it is desirable to have a noise transfer function that strongly suppresses the quantization noise within a band of interest and thus improves an in-band signal-to-quantization-noise ratio. For example, a choice of $g_1=11/6$, $g_2=2$, and $g_3=1$ would result in a classic third order noise transfer function of $(1-z^{-1})^3$.

When implementing a modulator in an integrated circuit, the internal parameters of the loop filter 230 (e.g., the coefficients g1, g2, and g3 of the loop filter 230 shown in FIG. 2) are usually determined by ratios between resistors or capacitors. Modern integrated circuits usually provide good matching between values of circuit components of the same kind. Although for each individual resistor/capacitor the value may be off by as much as 30%, for example, the ratio between the values of two resistors/capacitors of the same kind is usually very accurate (e.g., accurate to within 0.1%). Therefore, the effective values of the coefficients g1, g2, and g3 usually can be controlled very well in an integrated circuit. The biggest problem usually arises from the inaccuracies within the integrators.

A continuous-time integrator is usually implemented either by an OTA-C integrator shown in FIG. 4A or an R-C integrator shown in FIG. 4B. For the OTA-C integrator, an input voltage is converted into an output current by an operational transconductance amplifier (OTA). The output current is then integrated by a capacitor and converted into an output voltage. The voltage transfer function of the OTA-C integrator is $G_m/sC$, which matches the desired response of 1/sT if the transconductance $G_m$ and capacitor C are properly chosen such that $T=C/G_m$, i.e., the "time constant" $C/G_m$ is equal to the clock period. For the R-C integrator, due to the high gain of the operational amplifier, the transfer function for the input voltage to the output voltage is 1/sRC, which matches the desired response of 1/sT if the values of resistor R and capacitor C are properly chosen such that T=RC, i.e., the "time constant" RC is equal to the clock period. However, in practice, there is always spread in component values in a real circuit. For example, in a typical complementary metal oxide semiconductor (CMOS) integrated circuit, the uncertainty in the transconductance, resistor, and capacitor values may cause the value of $C/G_m$ or RC of an integrator to deviate from its design value by up to 30%. This usually causes performance degradation to the modulator. Worse yet, it may result in instability and cause the system to fail. In addition, both $C/G_m$ and RC are temperature dependent. Therefore, even if the value of $C/G_m$ or RC is calibrated at start-up, it may deviate from the initial value as the temperature drifts.

SUMMARY OF THE INVENTION

The present invention solves these and other problems by providing a modulator circuit that calibrates time constants of one or more internal integrators at start-up, intermittently, in response to a command signal, periodically or continuously. In one embodiment, the modulator circuit (or data conversion circuit) includes a delta-sigma modulator comprising a continuous-time loop filter with at least one internal integrator. The delta-sigma modulator is configured to receive a continuous-time input signal and a calibration signal for self-calibration. An estimator circuit generates an error signal indicative of time constant error based on the calibration signal and a discrete-time sequence at an output of the delta-sigma modulator. A controller circuit adjusts the time constant of the internal integrator according to the error signal. For example, the controller circuit outputs one or more controls signals to selectively connect circuit components (e.g., capacitors or resistors) in an array to the internal integrator to adjust its time constant.

In one embodiment, a calibrating sequence generator provides the calibration signal (e.g., a pseudo-random noise sequence or a periodic sequence). The calibration signal can be injected before or after an internal quantizer that is coupled between the continuous-time loop filter and the output of the delta-sigma modulator. In one embodiment, the calibration signal is generated independently of the continuous-time input signal and is uncorrelated with the continuous-time input signal to facilitate calibration during normal operation of the delta-sigma modulator.

In one embodiment, the estimator circuit includes an adaptive filter to estimate a noise transfer function of the delta-sigma modulator by examining correlation between the calibration signal and the discrete-time output sequence. For example, an adaptive finite impulse response (FIR) filter or an adaptive infinite impulse response (IIR) filter based on a least mean square (LMS) algorithm or other algorithms can be used to correlate the discrete-time output sequence with the calibration signal. In one embodiment, the estimator circuit further includes a logic circuit to examine one or more filter coefficients upon convergence of the adaptive filter to generate the error signal. For example, filter coefficients are compared with respective threshold values to determine whether the time constant of the internal integrator is too large or too small.

In one embodiment, a delta-sigma modulator includes a continuous-time loop filter with multiple integrators and one or more of the integrators are bypassed for stable calibration. For example, the delta-sigma modulator is downgraded to a first order modulator with one integrator in a signal processing path for initial calibration (e.g., during start-up). The time constants of some or all of the integrators are adjusted during the initial calibration. The bypassed integrators are restored after the initial calibration for normal operations and subsequent calibrations.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements.

DETAILED DESCRIPTION OF THE PREFERRED EMBODIMENT

The present invention relates to a method and apparatus for calibrating a delta-sigma modulator. While the specifications describes several example embodiments of the invention, it should be understood that the invention can be implemented in many way and is not limited to the particular examples described below or to the particular manner in which any features of such examples are implemented.

As mentioned above, continuous-time integrators are basic building blocks of a continuous-time delta-sigma modulator (DSM). The continuous-time integrators are implemented either using an OTA-C circuit or an R-C circuit. Both are characterized by a "time constant." For the OTA-C circuit, the "time constant" is $C/G_m$; for the R-C circuit, the "time constant" is RC. Inaccuracies of the time constants are major causes for the noise-shaping behavior of a modulator to deviate from a design target. Although the time constant of an integrator can deviate significantly from its nominal value in an integrated circuit, matching between the time constants of two integrators is usually very good. For example, if one integrator has a time constant that is 30% greater than a nominal design value, then another integrator of a similar kind within the same integrated circuit will also have a time constant that is about 30% greater than the nominal design value. Since all integrators match well in terms of the percentage of error in their time constants, the response of the modulator can be expressed as a function of the percentage of error in time constant. The percentage of error in time constant can then be extracted after characterizing the modulator response.

Figure 5:
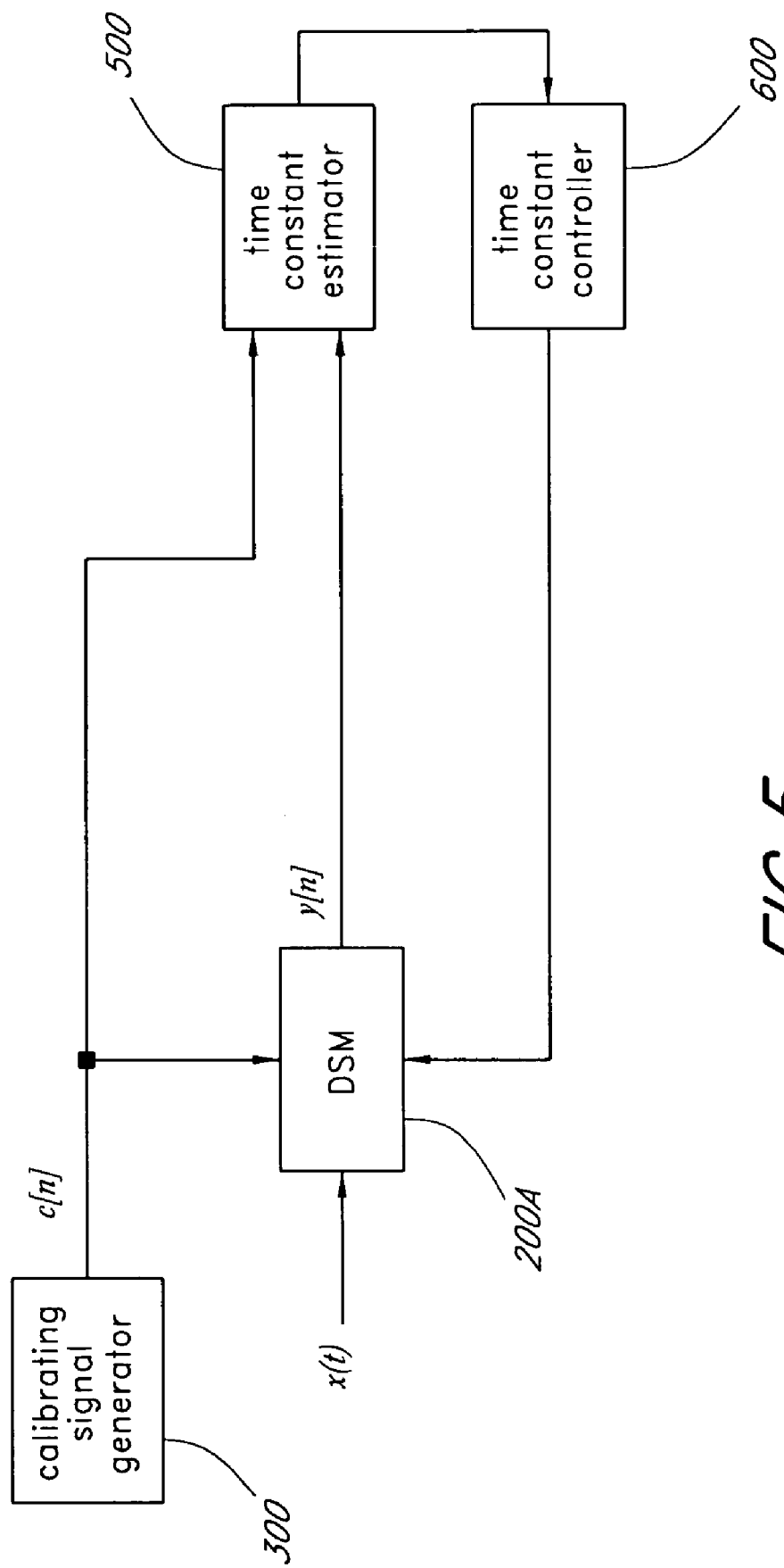
FIG. 5 is a block diagram of one embodiment of a modulator circuit with self-calibration.

A method of calibrating a continuous-time delta-sigma modulator in accordance with the present invention is depicted in FIG. 5. FIG. 5 illustrates one embodiment of a data conversion circuit comprising a DSM 200A, a calibrating signal generator 300, a time constant estimator 500, and a time constant controller 600. The DSM 200A converts an input continuous-time analog signal x(t) into an output sequence y[n]. The time constants of internal continuous-time integrators in the DSM 200A can be adjusted (or calibrated) according to one or more control signals generated by the time constant controller 600. The calibrating signal generator 300 generates a calibrating sequence c[n], which can be a pseudo-random noise (PN) sequence or a periodic sequence. The calibrating sequence c[n] is injected into the DSM 200A before or after an internal quantizer. The DSM 200A generates the output sequence y[n] in response to the calibrating sequence c[n] and the input signal x(t). The time constant estimator 500 examines correlation between the calibrating sequence c[n] and the output sequence y[n] of DSM 200A to decide whether or not the time constants of the internal integrators are too large or too small. The decision is provided to the controller 600 (e.g., via an error signal), and the controller 600 sends the control signals to adjust the time constants of the integrators in DSM 200A. The time constants can be calibrated at start-up, intermittently, in response to a command signal, periodically or continuously. For example, the calibrating sequence is uncorrelated to the input signal to facilitate calibration while the DSM 200A is processing the input signal.

Figure 1:
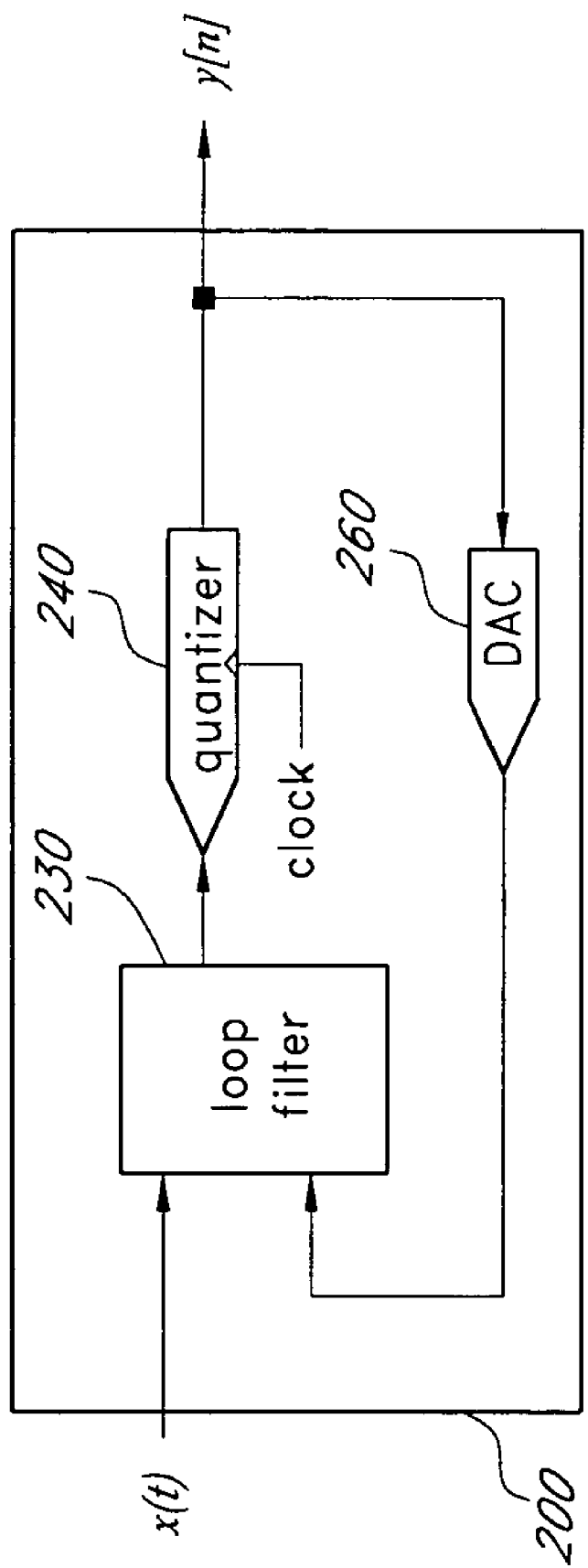
FIG. 1 is a block diagram of one embodiment of a delta-sigma modulator that uses a continuous-time loop filter.
Figure 2:
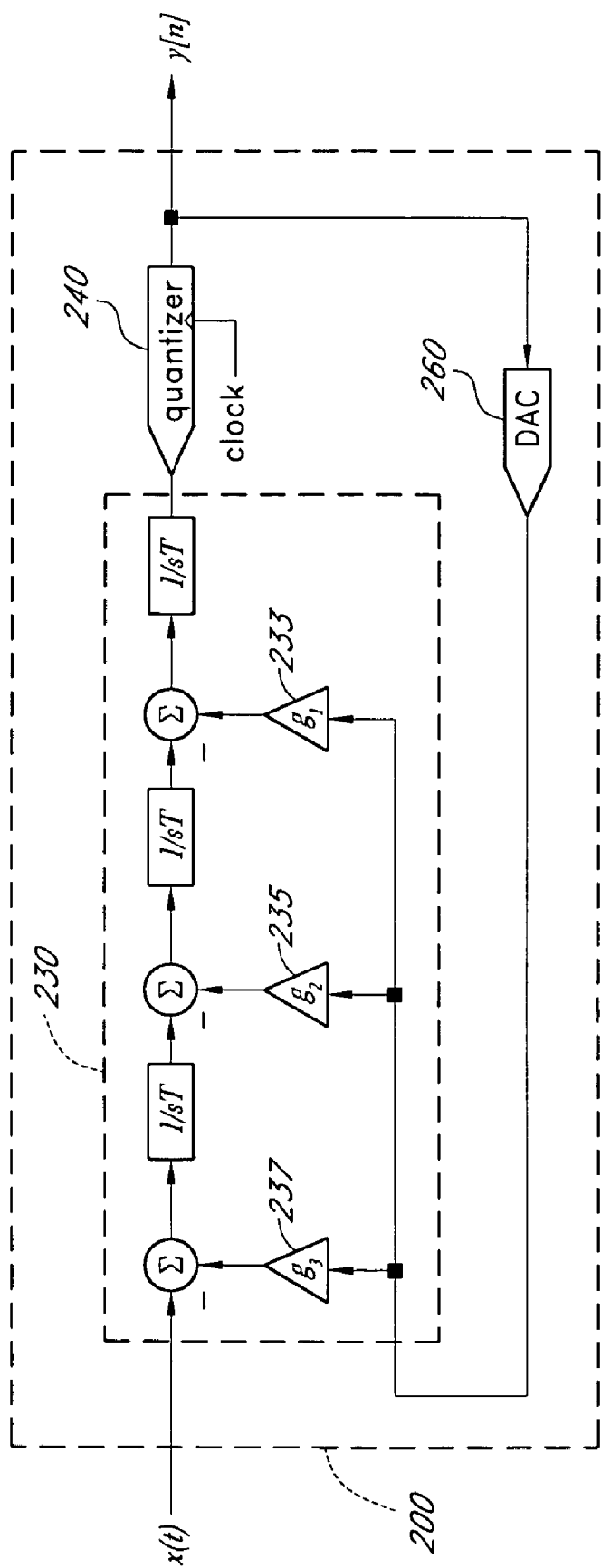
FIG. 2 illustrates one embodiment of a third order continuous-time loop filter using three integrators.
Figure 3B:
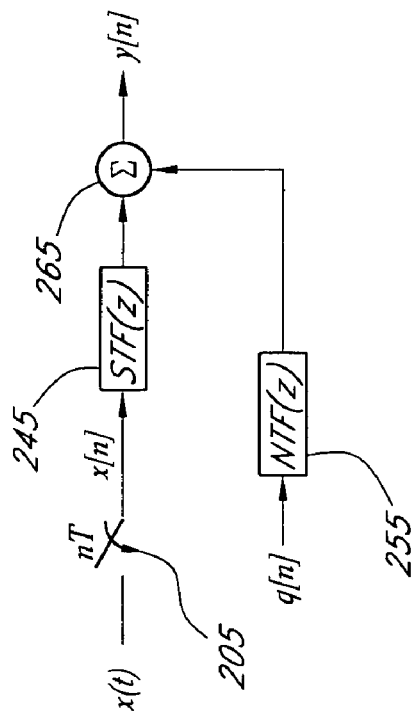
FIG. 3B illustrates another embodiment of a behavioral model for a continuous-time delta-sigma modulator.
Figure 3A:
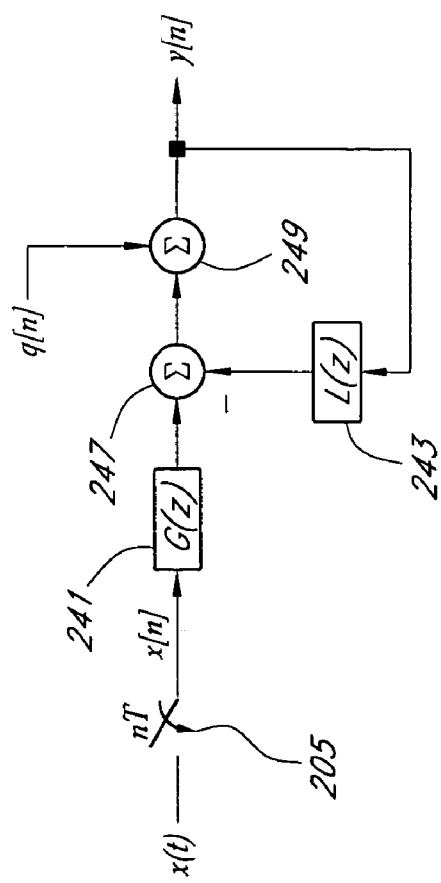
FIG. 3A illustrates one embodiment of a behavioral model for a continuous-time delta-sigma modulator.
Figure 4B:
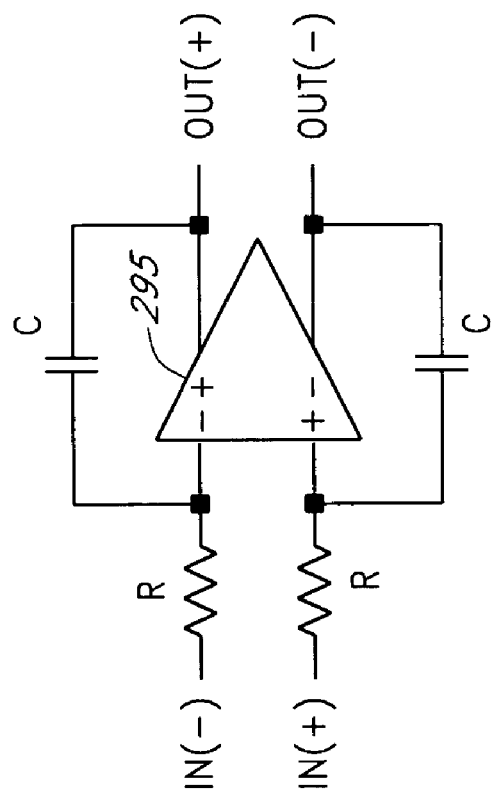
FIG. 4B is a schematic diagram of another embodiment of a continuous-time integrator.
Figure 4A:
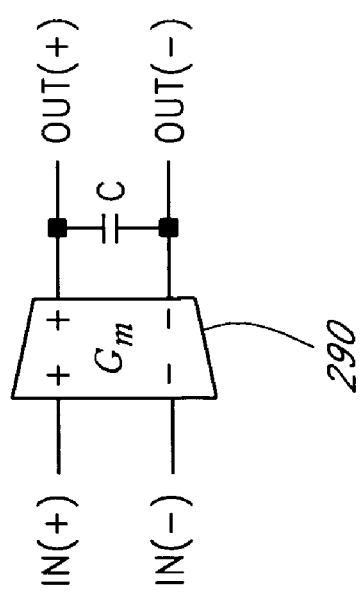
FIG. 4A is a schematic diagram of an embodiment of a continuous-time integrator.
Figure 6:
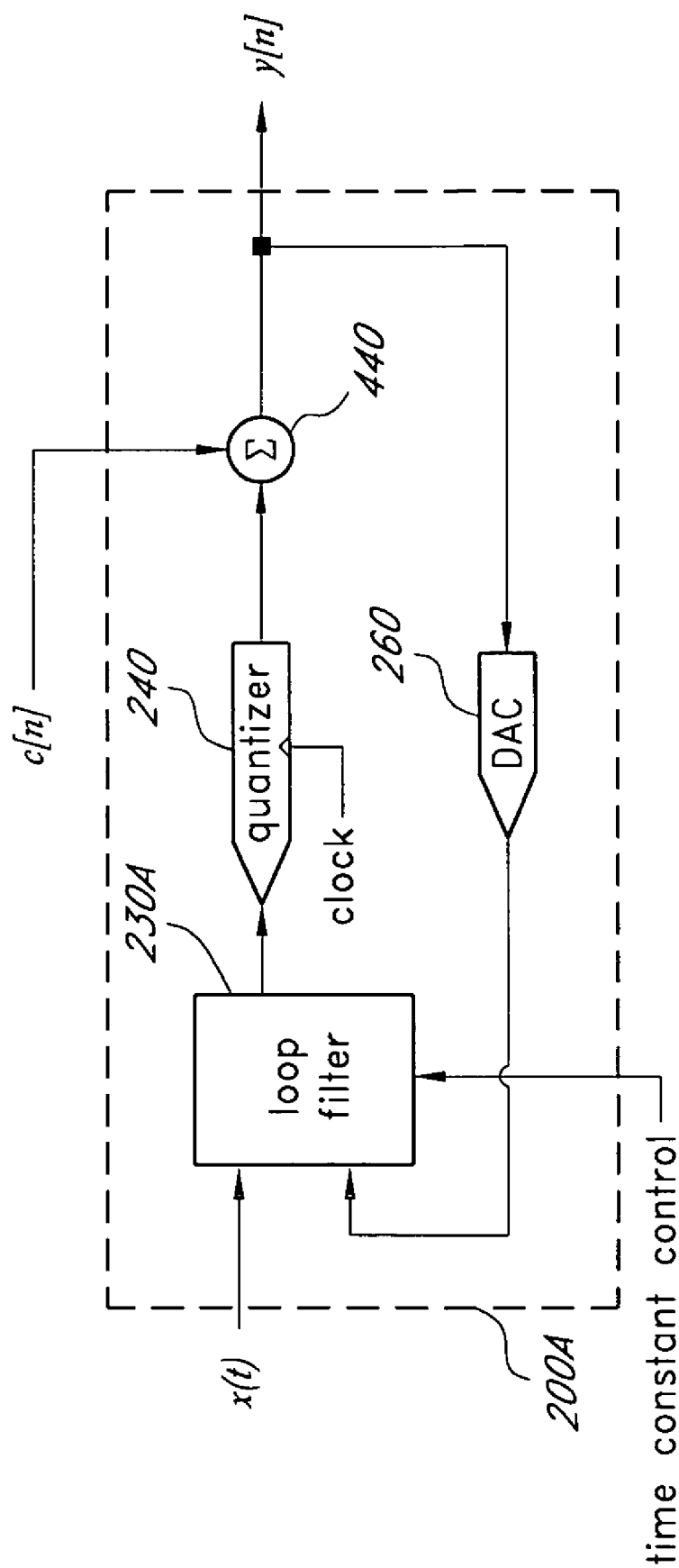
FIG. 6 is a block diagram of one embodiment of a self-calibrating delta-sigma modulator shown in FIG. 5.

FIG. 6 depicts an exemplary embodiment of the DSM 200A in accordance with the present invention. The DSM 200A includes at least one internal integrator with a response of k/sT inside a continuous-time loop filter 230A, where k is a gain factor that characterizes the inaccuracy of a time constant of the internal integrator. The continuous-time loop filter 230A shown in FIG. 6 is substantially similar to the exemplary continuous-time loop filter 230 shown in FIG. 2 except for the gain factor k associated with internal integrators. For example, the time constant is 30% greater than a nominal value if k=1.3. The time constant of the internal integrator inside the loop filter 230A can be adjusted by a time constant control signal sent from the time constant controller 600. By way of example, the calibrating signal c[n] is injected after a quantizer 240 via a summer 440 that combines an output of the quantizer 240 with the calibrating signal.

Figure 7:
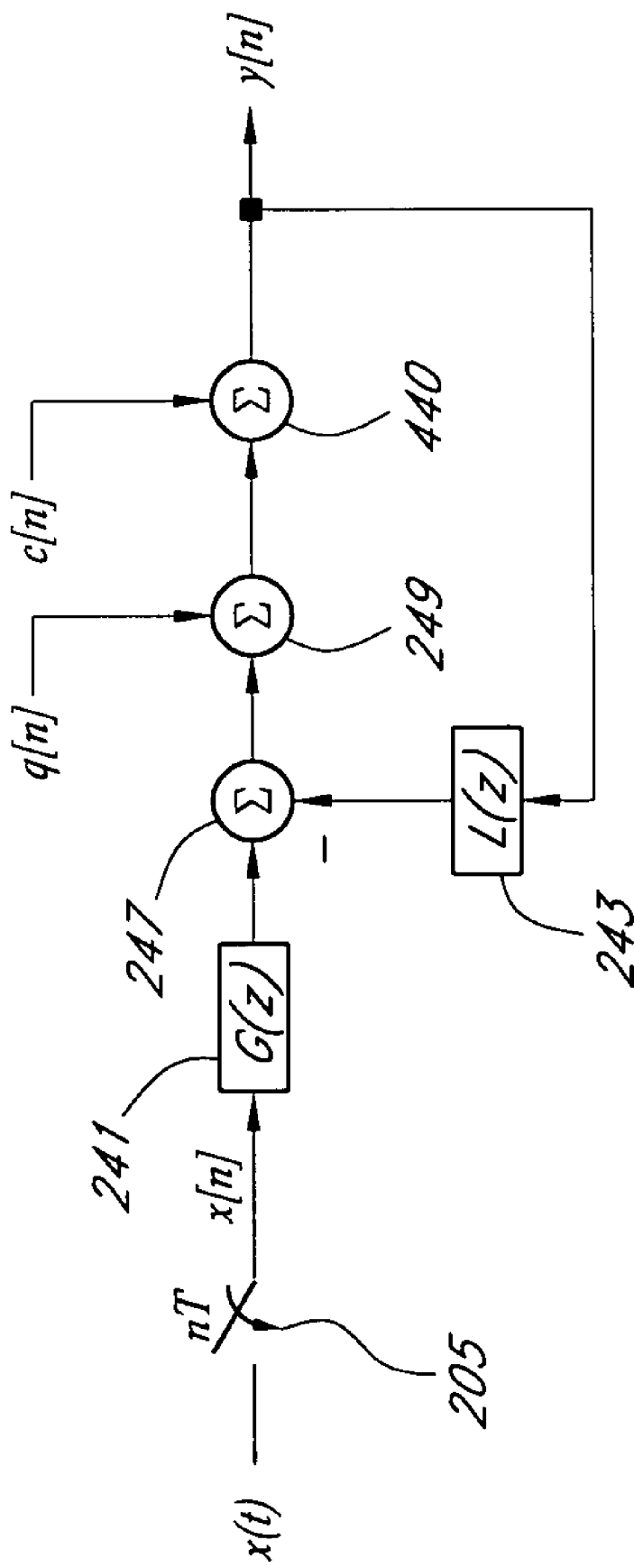
FIG. 7 illustrates one embodiment of a behavioral model for a self-calibrating delta-sigma modulator.

A behavioral model of the DSM 200A is depicted in FIG. 7 with the calibrating sequence c[n] added to a processing loop via a summer 440. Using this model, the output sequence y[n] in response to q[n], c[n], and x[n] is derived as follows:

$$Y(z)=[Q(z)+C(z)] \cdot NTF(z)+X(z) \cdot STF(z).$$

Y(z), Q(z), C(z), and X(z) are z-transforms of y[n], q[n], c[n], and x[n] respectively. The signal transfer function STF(z) and the noise transfer function NTF(z) have the following relationships:

$$STF(z)=G(z)/[1+L(z)]; \text{ and}$$

$$NTF(z)=1/[1+L(z)].$$

The response of filter L(z) is determined by the loop filter 230A. The modulator depicted in FIG. 6 has the following response:

$$L(z)=g_1 \cdot k/(z-1)+g_2/2 \cdot k^2 \cdot (z+1)/(z-1)^2+g_3/6 \cdot k^3 \cdot (z^2+4z+1)/(z-1)^3.$$

Thus, the NTF(z) has the following form:

$$NTF(z)=[1-z^{-1}]^3/[1+(g_1 \cdot k+g_2/2 \cdot k^2+g_3/6 \cdot k^3-3) \cdot z^{-1}+(-2 \cdot g_1 \cdot k+2 \cdot g_3/3 \cdot k^3+3) \cdot z^{-2}+(g_1 \cdot k-g_2/2 \cdot k^2+g_3/6 \cdot k^3-1) \cdot z^{-3}]$$

Among the four discrete-time sequences in the behavioral model of the DSM 200A (e.g., y[n], q[n], c[n], and x[n]), y[n] and c[n] are known. In one embodiment, the calibrating sequence c[n] is advantageously generated independently of the input, and is uncorrelated with both q[n] and x[n]. The correlation between y[n] and c[n] is determined by the noise transfer function, from which the scaling factor k and accordingly the inaccuracy of time constant can be extracted by exploiting that correlation.

Figure 8:
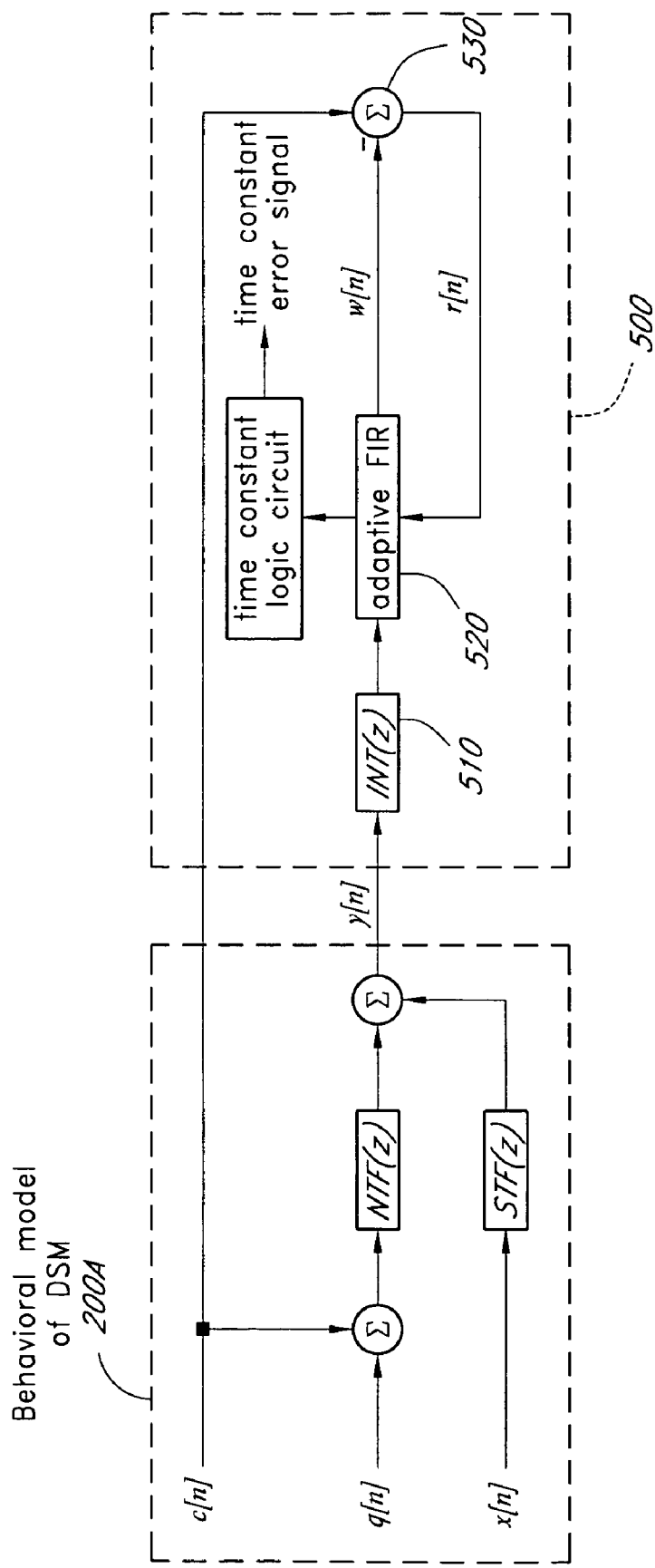
FIG. 8 illustrates one embodiment of a time constant estimator.

In one embodiment of the present invention, we use an adaptive finite impulse response (FIR) filter to estimate the noise transfer function of the DSM 200A as shown in FIG. 8. The DSM 200A is modeled behaviorally according to the relations among y[n] and q[n], c[n], and x[n] described above. The calibrating sequence c[n] and the output sequence y[n] are passed to the time constant estimator 500. In one embodiment, the time constant estimator 500 comprises an infinite impulse response (IIR) filter INT(z) 510, an adaptive FIR filter 520, and a summer 530. In one configuration, the response of INT(z) 510 is $INT(z)=1/[1-z^{-1}]^3$, which is a $3^{rd}$ order integrator that cancels the zeros of the noise transfer function NTF(z). The adaptive FIR filter 520 is continuously adapted so as to minimize a difference between it output sequence w[n] and the calibrating sequence c[n]. After being properly adapted, the adaptive FIR filter 520 in cascade with the fixed IIR filter 510 would form the following response:

$$[1+c_1 \cdot z^{-1}+c_2 \cdot z^{-2}+c_3 \cdot z^{-3}]/[1-z^{-1}]^3, \text{ where}$$

$$c_1=g_1 \cdot k+g_2/2 \cdot k^2+g_3/6 \cdot k^3-3;$$

$$c_2=-2 \cdot g_1 \cdot k+2 \cdot g_3/3 \cdot k^3+3; \text{ and}$$

$$c_3=g_1 \cdot k-g_2/2 \cdot k^2+g_3/6 \cdot k^3-1.$$

In other words, the fixed IIR filter INT(z) (or integrator) 510 in cascade with the adaptive FIR filter 520 results in a response that is the reciprocal of the NTF(z). In this manner, the integrator 510 and the adaptive FIR filter 520 will undo what DSM 200A has done to the calibrating sequence c[n]. The difference between the output w[n] of the adaptive FIR filter 520 and the calibrating sequence c[n] is computed using the summer 530, resulting in a residual sequence r[n] which is used to adapt the FIR filter 520 so as to minimize the residual sequence r[n].

Figure 9:
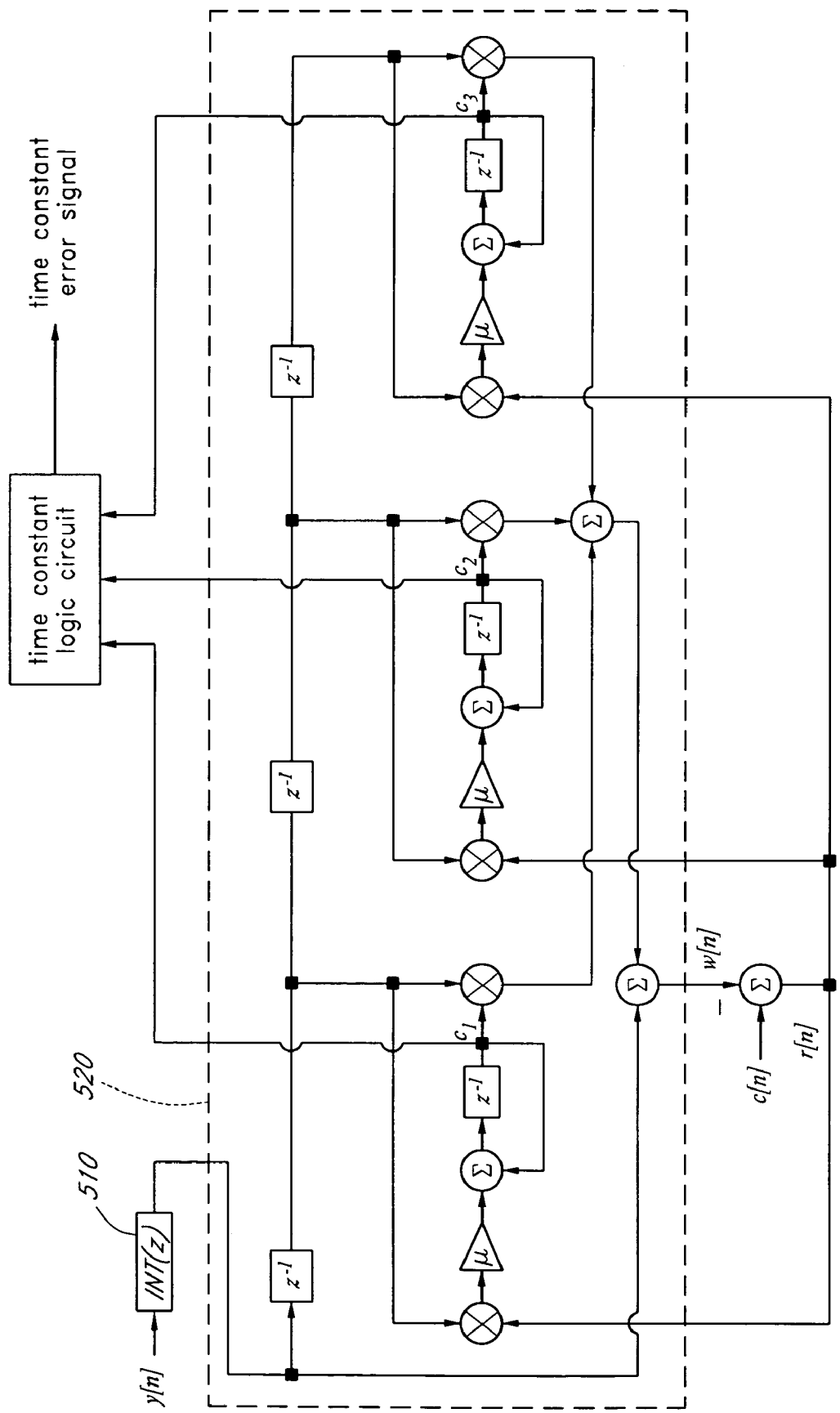
FIG. 9 illustrates one embodiment of an adaptive filter.

FIG. 9 depicts an exemplary embodiment of the adaptive FIR filter 520. The adaptive FIR filter 520 includes a gain factor μ corresponding to an adaptation step size. In one embodiment, the adaptation step size needs to be small enough for the adaptive FIR filter 520 to converge. In one configuration, the adaptive FIR filter 520 minimizes the residual sequence r[n] using a least-mean-square adaptation scheme. Other adaptation schemes (or algorithms) are also possible.

If the time constants of the internal integrators in the DSM 200A are approximately equal to the design value (e.g., k=1), a filter coefficient $c_1$ for the adaptive FIR filter 520 has the following relationship:

$$c_1 = g_1 + g_2/2 + g_3/6 - 3.$$

If the time constants are greater than the design value (e.g., k>1), the filter coefficient $c_1$ has the following relationship:

$$c_1 > g_1 + g_2/2 + g_3/6 - 3.$$

If the time constants are smaller than the design value (e.g., k<1), the filter coefficient $c_1$ has the following relationship:

$$c_1 < g_1 + g_2/2 + g_3/6 - 3.$$

In one embodiment, a time constant logic circuit compares the filter coefficient $c_1$ with an ideal (or threshold) value $g_1 + g_2/2 + g_3/6 - 3$ upon convergence of the adaptive FIR filter 520 to determine whether the time constants of the internal integrators are too large or too small. The information (e.g., a time constant error signal) is then passed to the time constant controller 600 to adjust the time constants of the internal integrators.

More than one coefficient of the adaptive FIR filter 520 can be examined for robust detection of errors (or deviations) in the time constants. For example, the value of a second filter coefficient $c_2$ is examined. If the time constants are approximately equal to the design value (e.g., k=1), the second filter coefficient $c_2$ has the following relationship upon convergence of the adaptive FIR filter 520:

$$c_2 = -2 \cdot g_1 + 2 \cdot g_3/3 + 3.$$

If the time constants deviate from the design value, the coefficient $c_2$ also deviates from the ideal (or threshold) value $-2 \cdot g_1 + 2 \cdot g_3/3 + 3$. The coefficient $c_2$ and the direction it deviates in response to time constant variations depends on the values of $g_1$ and $g_3$. For example, if $g_1 = 2$, $g_3 = 0.5$, and the time constants are slightly greater than the design value (e.g., k>1), the coefficient $c_2$ has the following relationship:

$$c_2 < -2 \cdot g_1 + 2 \cdot g_3/3 + 3.$$

Likewise, if $g_1 = 2$, $g_3 = 0.5$, and the time constants are slightly smaller than the design value (e.g., k<1), the coefficient $c_2$ has the following relationship:

$$c_2 > -2 \cdot g_1 + 2 \cdot g_3/3 + 3.$$

In one embodiment, the time constant logic circuit examines the values of $c_1$ and $c_2$ using the truth table shown in Table 1 to determine whether the time constants of the internal integrators are too large or too small. Similar truth tables can be established to examine one or more filter coefficients once the coefficients of the modulator (e.g., $g_1$, $g_2$, and so on) are determined. The time constant logic circuit generates a time constant error signal to adjust the time constants upon convergence of the adaptation of the filter coefficients (e.g., $c_1$, $c_2$, and so on).

TABLE 1

| Scenario | $c_2 > -2 \cdot g_1 + 2 \cdot g_3/3 + 3$ | $c_2 < -2 \cdot g_1 + 2 \cdot g_3/3 + 3$ |
|---|---|---|
| $c_1 > g_1 + g_2/2 + g_3/6 - 3$ | Inconclusive | Time constant is too large |
| $c_1 < g_1 + g_2/2 + g_3/6 - 3$ | Time constant is too small | Inconclusive |

Figure 10:
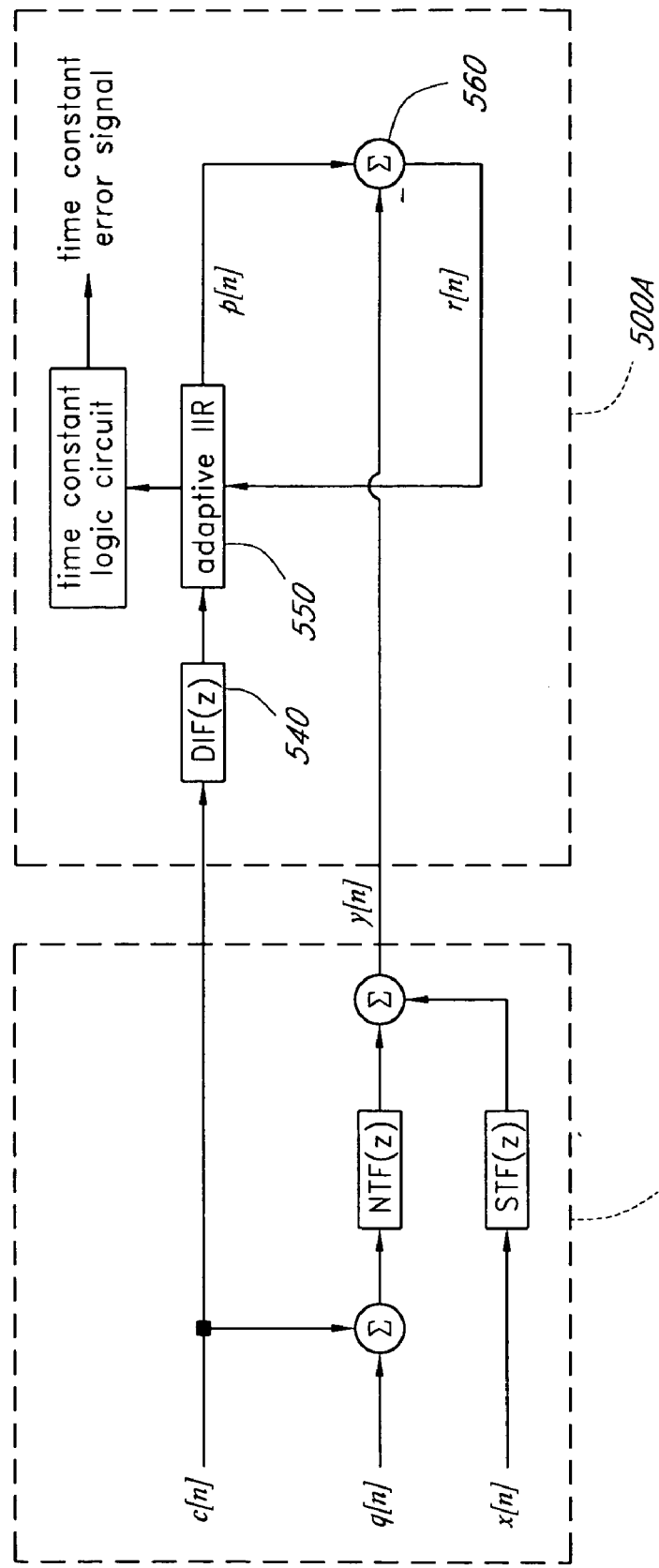
FIG. 10 illustrates another embodiment of a time constant estimator.

FIG. 10 illustrates an alternate embodiment of the time constant estimator 500 that uses an adaptive IIR filter to estimate the noise transfer function of the DSM 200A. For example, a FIR filter DIF(z) 540 is cascaded with an adaptive IIR filter 550 to filter the calibrating sequence c[n], resulting in a sequence p[n]. In one embodiment, the FIR filter DIF(z) 540 has a response of $[1-z^{-1}]^3$ to match the zeros of NTF(z). The adaptive IIR filter 550 is adapted so as to minimize a difference r[n] between p[n] and y[n]. The difference r[n] is generated by a summer 560.

Figure 11:
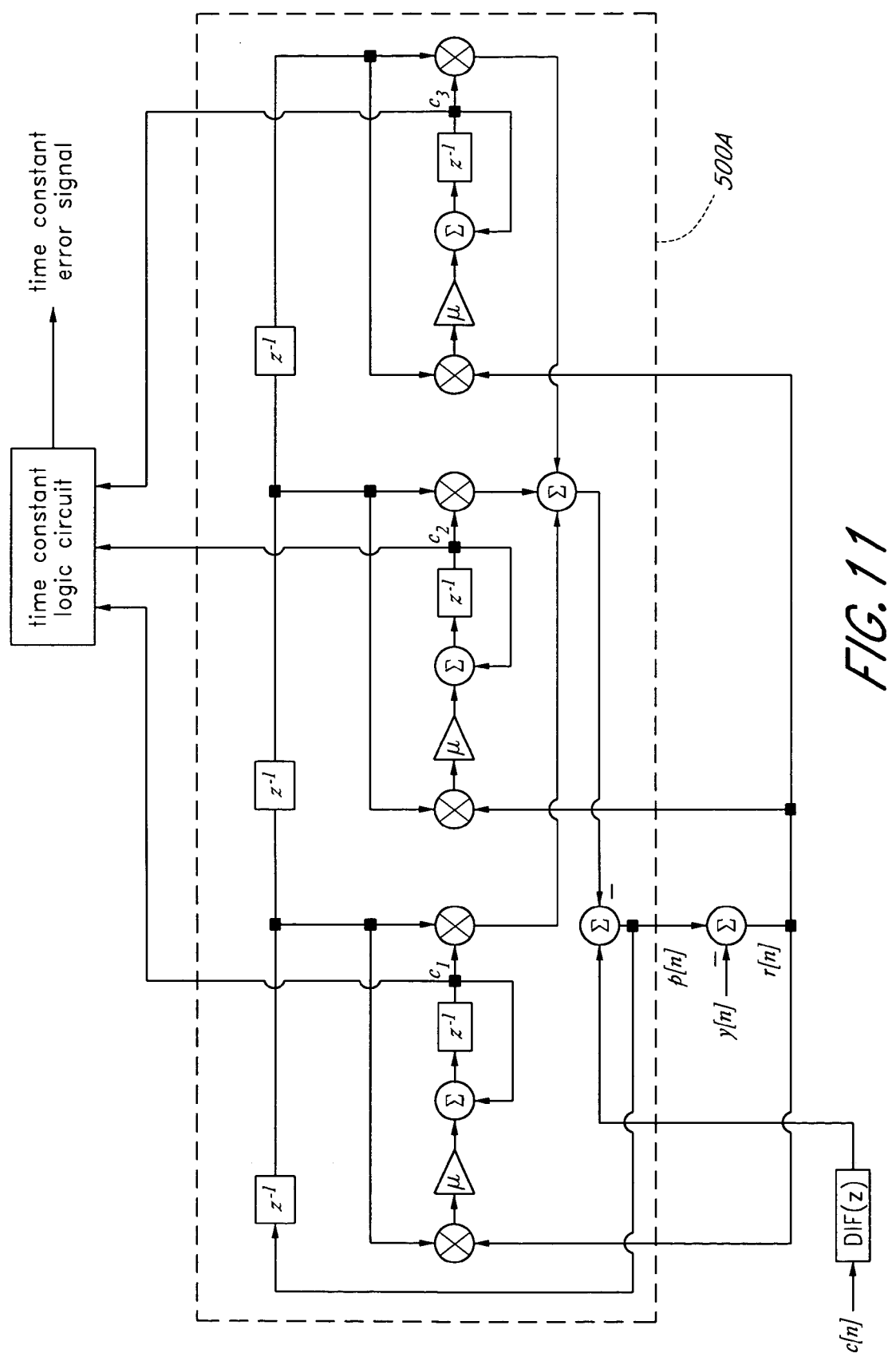
FIG. 11 illustrates another embodiment of an adaptive filter.

FIG. 11 depicts an exemplary embodiment of the adaptive IIR filter 550. The adaptive IIR filter 550 includes a gain factor μ corresponding to an adaptation step size. In one embodiment, the adaptation step size needs to be small enough for the adaptive IIR filter 550 to converge. In one configuration, the adaptive IIR filter 550 minimizes the residual sequence r[n] using a least-mean-square adaptation scheme. Other adaptation schemes (or algorithms) are possible. Upon convergence, the adaptive IIR filter 550 in cascade with the fixed FIR filter 540 results in a response that matches the noise transfer function of the modulator 200A. After being properly adapted, the FIR filter DIF(z) 540 in cascade with the adaptive IIR filter 550 has the following response:

$$[1-z^{-1}]^3 / [1 + c_1 \cdot z^{-1} + c_2 \cdot z^{-2} + c_3 \cdot z^{-3}], \text{ where}$$

$$c_1 = g \cdot k + g_2/2 \cdot k^2 + g_3/6 \cdot k^3 - 3;$$

$$c_2 = -2 \cdot g_1 \cdot k + 2 \cdot g_3/3 \cdot k^3 + 3; \text{ and}$$

$$c_3 = g_1 \cdot k - g_2/2 \cdot k^2 + g_3/6 \cdot k^3 - 1.$$

If the time constants of the internal integrators in the DSM 200A are approximately equal to the design (or threshold) value (e.g., k=1), a first filter coefficient of the adaptive IIR filter 550 has the following value:

$$c_1 = g_1 + g_2/2 + g_3/6 - 3$$

If the time constants are greater than the design value (e.g., k>1), the first filter coefficient of the adaptive IIR filter 550 has the following value:

$$c_1 > g_1 + g_2/2 + g_3/6 - 3$$

If the time constants are smaller than the design value (e.g., k<1), the first filter coefficient of the adaptive IIR filter 550 has the following value:

$$c_1 < g_1 + g_2/2 + g_3/6 - 3$$

In one embodiment, a time constant logic circuit compares the first filter coefficient of the adaptive IIR filter 550 with an ideal (or threshold) value (e.g., $g_1 + g_2/2 + g_3/6 - 3$) upon convergence to determine whether the time constants are too large or too small. The information is then passed to the time constant controller 600 to adjust the time constants of the internal integrators in the DSM 200A.

Similar to the method described above in connection with the adaptive FIR filter 520, more than one filter coefficient in the adaptive IIR filter 550 can be examined to improve robustness in detection of time constant error. For example, the value of a second filter coefficient $c_2$ in the adaptive IIR filter 550 is examined. If the time constants of the internal integrators are approximately equal to the design value (e.g., k=1), the second filter coefficient of the adaptive IIR filter 550 has the following value upon convergence:

$$c_2 = -2 \cdot g_1 + 2 \cdot g_3/3 + 3.$$

If the time constants deviate from the design value, the second filter coefficient $c_2$ also deviates from the ideal value $-2 \cdot g_1 + 2 \cdot g_3/3 + 3$. The direction of deviation (e.g., higher or lower) depends on the values of $g_1$ and $g_3$. For example, if $g_1$=2, $g_3$=0.5 and the time constant is slightly greater than the design value (e.g., k>1), the second filter coefficient has the following value:

$$c_2 < -2 \cdot g_1 + 2 \cdot g_3/3 + 3.$$

Likewise, if $g_1$=2, $g_3$=0.5 and the time constant is slightly smaller than the design value (e.g., k<1), the second filter coefficient has the following value:

$$c_2 > -2 \cdot g_1 + 2 \cdot g_3/3 + 3.$$

In one embodiment, the time constant logic circuit examines the values of $c_1$ and $c_2$ using the truth table shown in Table 2 to determine whether the time constants of the internal integrators are too large or too small. Similar truth tables can be established to examine one or more filter coefficients once the coefficients of the modulator (e.g., $g_1$, $g_2$, and so on) are determined. The time constant logic circuit generates a time constant error signal to adjust the time constants upon convergence of the adaptation of the filter coefficients (e.g., $c_1$, $c_2$, and so on).

TABLE 2

| Scenario | $c_2 > -2 \cdot g_1 + 2 \cdot g_3/3 + 3$ | $c_2 < -2 \cdot g_1 + 2 \cdot g_3/3 + 3$ |
| --- | --- | --- |
| $c_1 > g_1 + g_2/2 + g_3/6 - 3$ | Inconclusive | Time constant is too large |
| $c_1 < g_1 + g_2/2 + g_3/6 - 3$ | Time constant is too small | Inconclusive |

In the schemes presented in FIG. 8 and FIG. 10, the internal integrators inside the DSM 200A are assumed to have zero leakage. In practice, the internal integrators have some leakage and their responses become $k/(sT+\beta)$, where $\beta$ is a constant that characterizes the leakage of the integrator. To make the schemes more robust, the leakage is taken into account and the integrator block 510 in FIG. 8 is modified to has a response of $1/[1-\gamma \cdot z^{-1}]^3$ or the differentiation block 540 in FIG. 10 is modified to have a response of $[1-\gamma \cdot z^{-1}]^3$, where $\gamma = \exp(-\beta)$ is the leakage factor of a discrete-time integrator.

Figure 12B:
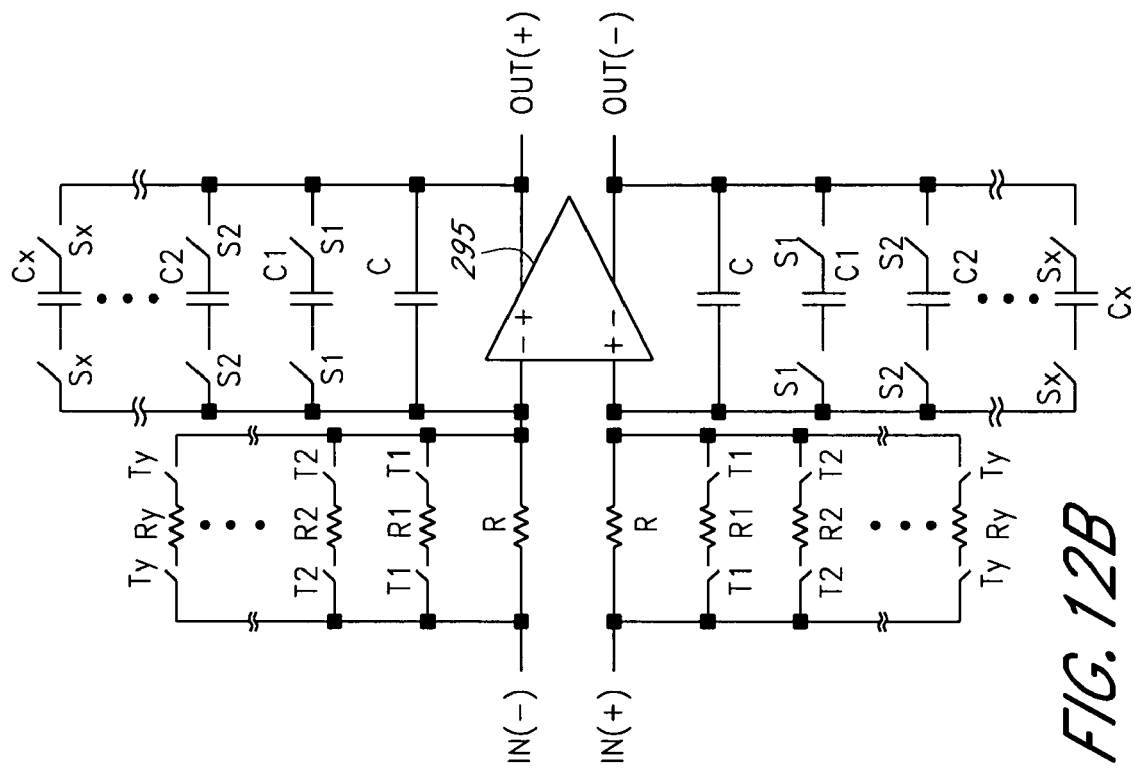
FIGS. 12A and 12B illustrate embodiments of integrators with adjustable time constants.
Figure 12A:
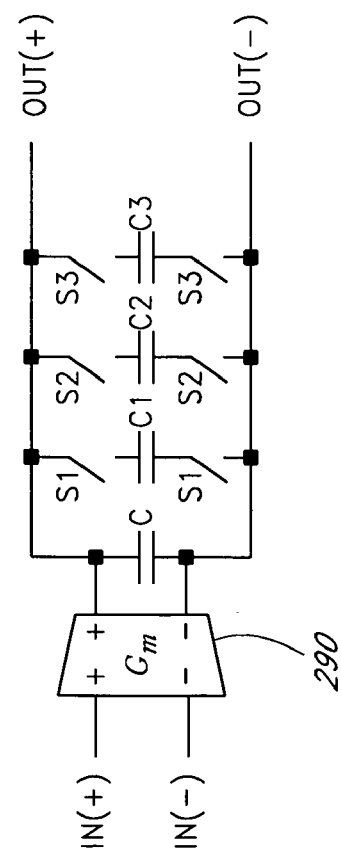

In one embodiment, the time constant estimator outputs a time constant error signal to indicate whether the time constant is too large or too small and provides the error signal to the time constant controller 600. The time constant controller 600 provides one or more control signals to adjust the time constants of the integrators in the DSM 200A. There are numerous ways to adjust the time constant of a continuous-time integrator. In one embodiment shown in FIG. 12A, an array of capacitors is used to adjust the output capacitance, and therefore the time constant, of an OTA-C integrator. For example, the time constant controller 600 provides control signals S1, S2, and S3 to control switches that allow the integrator to selectively include or exclude capacitors C1, C2, and C3, respectively, as part of its output capacitance. A similar arrangement can be used for an R-C integrator. By way of example, FIG. 12B illustrates an R-C integrator with arrays of resistors and arrays of capacitors for adjusting its time constant.

In a modulator with multiple internal integrators in a processing loop, the modulator may be initially unstable if the time constants of the internal integrators deviate too much from a nominal value. Time constant calibration may fail if the modulator becomes unstable. Thus, a method that restricts the range of the time constants (e.g., within 30% of a target value) during initial calibration is desirable. In one embodiment, the number of internal integrators in the processing loop is reduced during initial calibration. For example, one or more of the internal integrators may be bypassed or a calibration path with fewer internal integrators may be used for the initial calibration.

Figure 13:
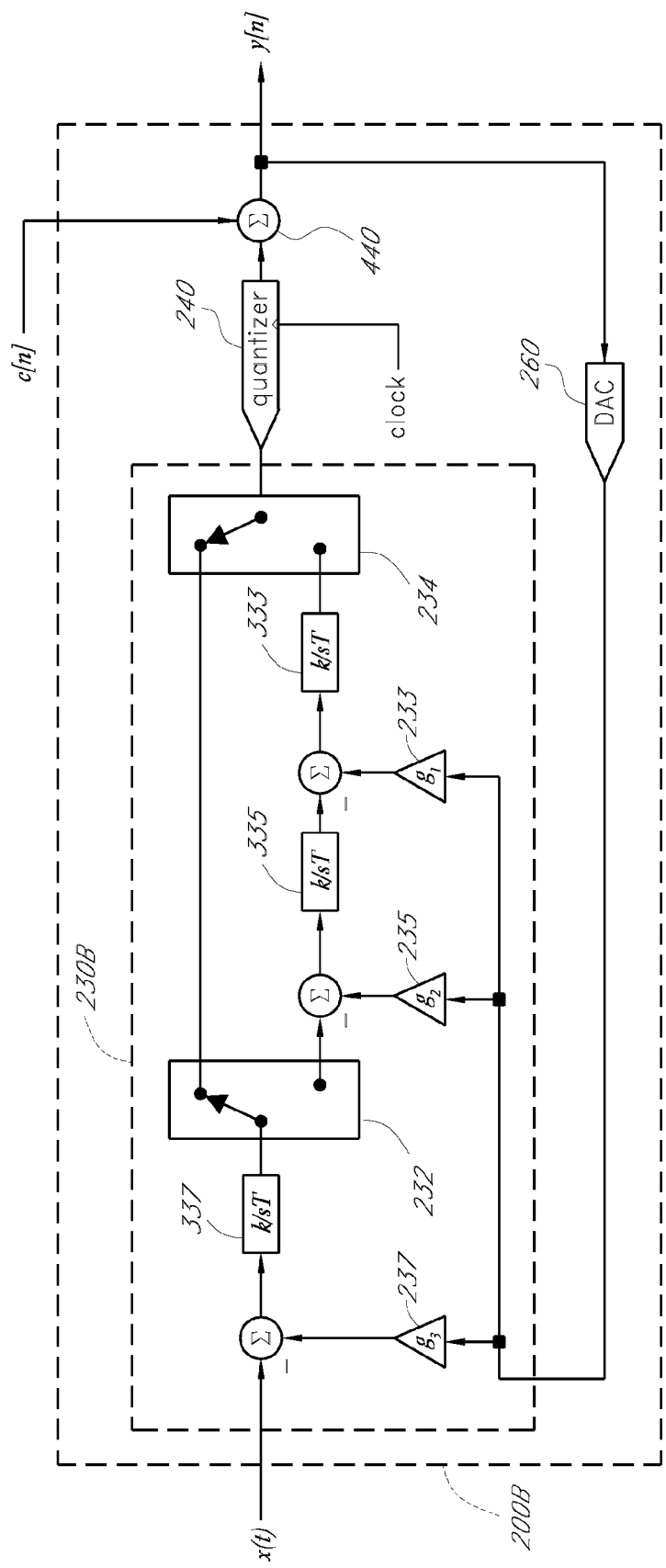
FIG. 13 illustrates one embodiment of a self-calibrating delta-sigma modulator with bypass circuits for initial calibration.

By way of example, FIG. 13 shows a third order modulator 200B that is downgraded to a first order modulator for the initial calibration during start-up. The third order modulator 200B shown in FIG. 13 includes two switches 232, 234 that can selectively bypass integrators 333 and 335 to temporarily configure the modulator 200B as a first order modulator. The first order modulator is stable even if the remaining integrator has a highly inaccurate time-constant (e.g., a time constant that is 50% off from a nominal value). After the time constant of the first order modulator is calibrated within certain accuracy (e.g., no more than 30% off), the switches 232 and 234 are placed into normal positions to restore the modulator to the third order configuration for normal operations or subsequent calibration. In this manner, the modulator can function correctly even with a very large initial inaccuracy in the time constants of internal integrators. In one embodiment, the time constants of the bypassed integrators are adjusted in a similar manner as the remaining integrator during the initial calibration.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

What is claimed is:

1. A data conversion circuit comprising:
   a delta-sigma modulator for generating a discrete-time output sequence, wherein the delta-sigma modulator comprises a continuous-time loop filter comprising at least two integrator circuits and a switching circuit configured for selectively bypassing at least one of the integrator circuits, the switching circuit bypasses at least one of the integrator circuits during calibration such that the delta-sigma modulator has a lower order continuous-time loop filter and restores at least one of the bypassed integrator circuits after calibration such that the delta-sigma modulator has a higher order continuous-time loop filter, and the delta-sigma modulator is configured to receive a calibration signal and a continuous-time input signal;
   an estimator circuit configured to generate an error signal based on the calibration signal and the discrete-time output sequence; and a controller circuit configured to adjust at least one time constant of the integrator circuits based on the error signal.

2. The data conversion circuit of claim 1 wherein the estimator circuit comprises an adaptive filter circuit to correlate the discrete-time output sequence with the calibration signal.

3. The data conversion circuit of claim 2 wherein the adaptive filter circuit is based on a least mean square algorithm.

4. The data conversion circuit of claim 2 wherein the adaptive filter circuit comprises a fixed finite impulse response filter in cascade with an adaptive infinite impulse response filter.

5. The data conversion circuit of claim 2 wherein the adaptive filter circuit comprises an adaptive finite impulse response filter in cascade with a fixed infinite impulse response filter.

6. The data conversion circuit of claim 2 wherein the error signal is generated based on at least one filter coefficient of the adaptive filter circuit.

7. The data conversion circuit of claim 2 wherein the estimator circuit further comprises a logic circuit that compares at least one filter coefficient of the adaptive filter circuit with a respective threshold value to generate the error signal.

8. The data conversion circuit of claim 1 wherein the controller circuit outputs at least one control signal for selectively connecting capacitors or resistors in an array to the integrator circuit.

9. The data conversion circuit of claim 1 wherein the delta-sigma modulator further comprises a quantizer coupled between the continuous-time loop filter and an output of the delta-sigma modulator, and the calibration signal is injected into the delta-sigma modulator via a summing circuit at one of the following locations: a quantizer input and a quantizer output.

10. The data conversion circuit of claim 1 wherein the calibration signal is a pseudo-random sequence.

11. The data conversion circuit of claim 1 wherein the calibration signal is a periodic sequence.

12. The data conversion circuit of claim 1 wherein at least one time constant of the integrator circuits is adjusted based on at least one of the following: at start-up, intermittently, in response to a user command signal, periodically and continuously.

13. The data conversion circuit of claim 1 wherein the calibration signal and the continuous-time input signal are uncorrelated and processed together in the delta-sigma modulator for continuous calibration of at least one of the integrator circuits.

14. A method of calibrating a delta-sigma modulator that receives a continuous-time input signal, generates a discrete-time output sequence, and comprises at least a first integrator and a second integrator, the method comprising:

reducing a number of integrators in a processing loop to lower the delta-sigma modulator's order during calibration;

injecting a calibration signal into the lower order delta-sigma modulator;

generating an error signal based on the calibration signal and the discrete-time output sequence; and adjusting a time constant for at least one of the integrators in the processing loop of the lower order delta-sigma modulator in response to the error signal.

15. The method of claim 14 wherein generating the error signal comprises:

using an adaptive filter to estimate a noise transfer function of the lower order delta-sigma modulator; and comparing one or more filter coefficients of the adaptive filter to respective threshold values after convergence of the adaptive filter.

16. The method of claim 14 wherein adjusting the time constant comprises selectively connecting circuit components in an array for the integrator.

17. The method of claim 14 wherein the time constant of the second integrator is adjusted during an initial calibration in which the first integrator is not in the processing loop and the time constant of the first integrator is adjusted during a subsequent calibration.

18. The method of claim 14 further comprising bypassing the first integrator during calibration and restoring the bypassed integrator after calibration.

19. A data conversion circuit comprising:

an adjustable order modulator for receiving a calibration signal and a continuous-time input signal to generate a discrete-time output sequence, wherein the adjustable order modulator comprises a plurality of integrators and a switch module for reducing a number of the integrators in a processing loop of the data conversion circuit during calibration;

an estimator circuit for generating an error signal based on the calibration signal and the discrete-time output sequence; and a controller circuit for adjusting a time constant for at least one of the integrators in the data conversion circuit in response to the error signal.

20. The data conversion circuit of claim 19 wherein the adjustable order modulator is a first order modulator during calibration and is a higher order modulator after calibration.

21. The data conversion circuit of claim 19 wherein a time constant for a first integrator in the adjustable order modulator is adjusted during a first calibration and a time constant for a second integrator in the adjustable order modulator is adjusted during a second calibration.

* * * * *